United States Patent [19]

Sadamori

[11] Patent Number: 4,559,697

[45] Date of Patent: Dec. 24, 1985

[54] METHOD OF FIXING INSERTION ELECTRODE PANEL IN COMPRESSION-BONDED SEMICONDUCTOR DEVICE

[75] Inventor: Masaaki Sadamori, Itami, Japan

[73] Assignee: Mitsubishi Denki Kabushiki Kaisha, Tokyo, Japan

[21] Appl. No.: 683,314

[22] Filed: Dec. 18, 1984

[30] Foreign Application Priority Data

Feb. 23, 1984 [JP] Japan ................................. 59-34531

[51] Int. Cl.$^4$ ........................................... H01L 21/60
[52] U.S. Cl. ....................................... 29/590; 29/589; 29/759; 29/834; 264/259; 264/272.17; 357/39
[58] Field of Search ................. 29/589, 590, 759, 612, 29/834, 835; 357/38, 39; 264/259, 272.17

[56] References Cited

U.S. PATENT DOCUMENTS 4,040,170  8/1977  Schlegel et al. ...................... 29/590
4,352,118  9/1982  Temple ................................. 357/38

FOREIGN PATENT DOCUMENTS 77930  5/1983  European Pat. Off. .............. 357/39

*Primary Examiner*—James Lowe
*Attorney, Agent, or Firm*—Lowe King Price & Becker

[57] ABSTRACT

A method of fixing an insertion electrode panel in a compression-bonded semiconductor device, in which a screen (20) having a pattern portion (22a) is aligned on a semiconductor element (1) having an electrode pattern (3), which pattern portion (22a) is formed identically to the electrode pattern (3), a cold-setting silicon rubber solution is dropped on the screen to be attached on the electrode pattern, whereby an aligning pattern member (23) is formed in a projecting manner, and then the insertion electrode panel (4) is overlapped on the semiconductor element in alignment with the same with the pattern hole (5) fitted with the aligning pattern member, and is fixed to the same by attaching a passivation rubber member (6) on its outer circumferential portion.

6 Claims, 6 Drawing Figures

METHOD OF FIXING INSERTION ELECTRODE PANEL IN COMPRESSION-BONDED SEMICONDUCTOR DEVICE

BACKGROUND OF THE INVENTION

1. Field of the Invention

The present invention relates to a method of fixing an insertion electrode panel in a compression-bonded semiconductor device. More specifically, it relates to an improvement in a method of fixing an insertion electrode panel in a compression-bonded semiconductor device such as a compression-bonded power thyristor, in which the insertion electrode panel is overlapped on a semiconductor element.

2. Description of the Prior Art

As a power thyristor has become of a larger capacity in recent years, the diameter of the silicon substrate of an element employed therein has become as large as about 90 to 102 mm. Further, since such a thyristor is applied to a high-frequency device, it is extremely important to increase initial turn-on areas, i.e., to increase the turn-on speed as much as possible.

As means for increasing the initial turn-on areas, there is generally employed a method in which an auxiliary thyristor is provided in the vicinity of a gate electrode so that the auxiliary thyristor is first turned on, thereby to turn on the main thyristor region. Further, in view of wide-ranged use of the device, means is employed to incorporate such an auxiliary thyristor into the main thyristor, whereon the structure is complicated for facilitating turning-on of the main thyristor.

As another technical means for ensuring large capacity of a thyristor, there is employed a method of bringing a thyristor element and an outer electrode disc member into pressure contact with each other, in which a relatively thin insertion electrode panel is inserted between the electrode of the inner thyristor element and the outer electrode disc for bringing the same into pressure contact with each other and carrying a current to the same.

FIG. 1 is a perspective view showing a semiconductor element and an insertion electrode panel before coupling by a conventional fixing method, and FIG. 2 is a roughly illustrated cross-sectional view showing an example of a compression-bonded thyristor assembled by sealing the semiconductor element to which the insertion electrode panel as shown in FIG. 1 is fixed.

Referring now to FIGS. 1 and 2, description is made with respect to a conventional method of fixing an insertion electrode panel to an element of a compression-bonded thyristor. A thyristor 1 has on its smoothed surface a gate electrode 2 provided in the central position thereof and an electrode pattern 3 of an auxiliary thyristor formed radially from the central position. An insertion electrode panel 4 is formed by a thin panel of conductive metal such as molybdenum, tungsten, kovar (alloyed stone), silver and copper, and is connected to an electrode (cathode) overlapped on the thyristor element 1 in a compression-bonded manner. The insertion electrode panel 4 is provided with a pattern hole 5 which corresponds in form to the electrode pattern 3 for receiving the same.

The insertion electrode panel 4 is overlapped on the thyristor element 1 in a close contact manner, and a passivation rubber member 6 is attached to the outer circumferential portion thereof to be hardened, whereby the insertion electrode panel 4 is fixed to the thyristor element 1. Under this condition, the thyristor element 1 is held from below by an electrode disc (anode) 7 of copper etc. and from above by an outer electrode disc (cathode) 8 of copper etc. through the insertion electrode panel 4 to be compression-bonded with the same. The compression-bonded thyristor element 1 and the insertion electrode panel 4 are then sealed by enclosing the side circumferential portion of the thyristor element 1 by an insulating enclosure 9 of, e.g., ceramic material. A contact ring 10 of, e.g., copper is brought sealingly into contact with the lower portions of the outer electrode disc 7 and the insulating enclosure 9 and fixed thereto by brazing. A coupling flange 11 made of a metal plate is fixed in an airtight manner to the upper portion of the insulating enclosure 9. The coupling flange 11 is coupled in an airtight manner, by welding etc., with another coupling flange 12 of a metal plate, which is airtightly fixed to the outer electrode disc 8.

It is to be noted that a gate lead wire and means for withdrawing the same are not shown in FIG. 2.

In the aforementioned conventional method of fixing the insertion electrode panel 4, there have been the following disadvantages: When the insertion electrode panel 4 is overlapped with the thyristor element 1 with the pattern hole 5 aligned with the electrode pattern 3 and the passivation rubber member 6 is fixed to the same to be hardened, displacement may take place between the pattern hole 5 and the electrode pattern 3 during the hardening process of the passivation rubber material. Further, when the electrode pattern 3 is made complicated, it is difficult to align the pattern hole 5 with the same by hand. In addition, the insertion electrode panel 4 is slightly larger in outer diameter than the electrode pattern 3 of the thyristor element 1 to ensure current carrying capacity and the inner contact surface of the outer electrode disc 8 is conformed in outer diameter to the insertion electrode panel 4, whereby merely a small amount of the passivation rubber member 6 is employed for fixing the insertion electrode panel 4. Thus, the insertion electrode panel 4 cannot be reliably fixed to the thyristor element 1, leading to displacement from the same.

Although projections and recesses for alignment may be provided in the contact surfaces of the insertion electrode panel 4 and the thyristor element 1, the surface of the insertion electrode panel 4 is smoothly formed for facilitating electric contact and is made extremely thin within the range of 0.2 to 0.5 mm for preventing electric resistance loss, and hence it is not possible to provide projections or recesses for alignment on the same. In correspondence thereto, further, it is extremely difficult to provide engaging projections or recesses on the smooth upper surface of the thyristor element 1.

Thus, in the conventional fixing method, the insertion electrode panel 4 might be displaced from the thyristor element 1 during assembling and after completion of the assembling operation.

SUMMARY OF THE INVENTION

Accordingly, an essential object of the present invention is to provide a method of fixing an insertion electrode panel in a compression-bonded semiconductor device in which the insertion electrode panel is not displaced with respect to a semiconductor element during assembling and after completion of the assembling operation.

According to the present invention, briefly stated, an aligning pattern member is attached onto an electrode pattern provided on the surface of a semiconductor element, which aligning pattern member is in the form identical to that of the electrode pattern, and a pattern hole of an insertion electrode panel is fitted with the aligning pattern member, whereby the insertion electrode panel is brought into contact with the semiconductor element in alignment therewith, and the outer circumferential portion of the insertion electrode panel is fixed to the semiconductor element by a passivation rubber member.

According to the present invention, therefore, since the insertion electrode panel is fixed to the semiconductor element extremely correctly in alignment with the same, the insertion electrode panel is not displaced with respect to the semiconductor element during assembling and after completion of the assembling operation.

In a preferred embodiment of the present invention, a silicon rubber member is attached onto an electrode pattern of a semiconductor element by screen printing to be hardened or an aligning pattern member of inorganic insulating material provided in a form identical to that of an electrode pattern of a semiconductor element is attached on the electrode pattern member by a binder.

The above and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
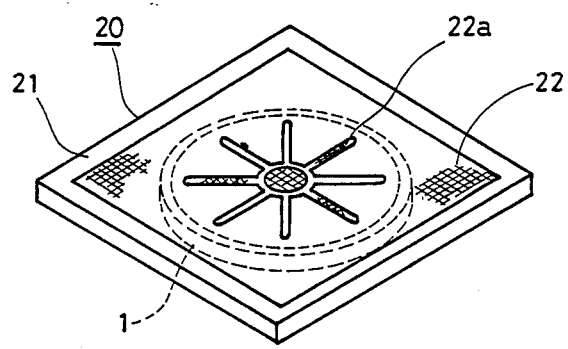
FIG. 3 is a perspective view showing an embodiment of the present invention, illustrative of a state in which a printing screen member is placed on a semiconductor element.
Figure 4:
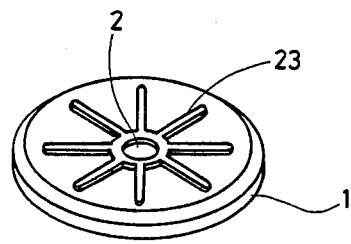
FIG. 4 is a perspective view illustrative of a state in which an aligning pattern member is attached to the semiconductor element as shown in FIG. 3.
Figure 5:
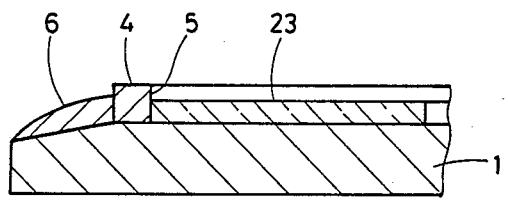
FIG. 5 is an enlarged cross-sectional view illustrative of a state in which an insertion electrode panel is fixed to the semiconductor element as shown in FIG. 4.

FIG. 3 is a perspective view illustrative of an embodiment of the present invention, showing a state in which a printing screen member is placed on a semiconductor element and FIG. 4 is a perspective view showing a state in which an aligning pattern member is attached to the semiconductor element as shown in FIG. 3, while FIG. 5 is an enlarged cross-sectional view showing a state in which an insertion electrode panel is fixed to the semiconductor element as shown in FIG. 4.

Figure 1:
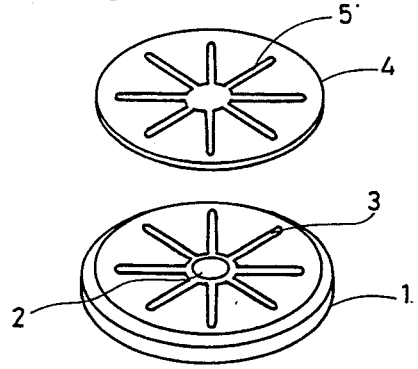
FIG. 1 is a perspective view of a thyristor element and an insertion electrode panel before coupling by a conventional fixing method.

First, as shown in FIG. 3, a printing screen member 20 is placed on a thyristor element 1 in alignment with the same. The printing screen member 20 is formed by a supporting frame 21 and a screen 22 fitted in the supporting frame 21. The supporting frame 21 is formed by stainless steel, aluminum or the like in the form of, e.g., a square. The screen 22 is formed by stainless steel meshes, polyethylene terephthalate meshes, nylon meshes etc. in thickness of 0.2 to 0.5 mm. The screen 22 is provided with a pattern portion 22a which is formed in correspondence to an electrode pattern 3 of the thyristor element 1 as shown in FIG. 1. The pattern portion 22a is formed as a slit having width of, e.g., 0.2 to 4 mm. Any portion other than the pattern portion 22a of the screen 22 is subjected to coating of a photosensitive emulsion (diazo resin) or nickel plating etc. for filling up the meshes. The printing screen member 20 is so located on the thyristor element 1 that the pattern portion 22a is overlapped with the electrode pattern 3.

Then, a cold-setting silicon rubber solution is dropped on the screen 22, to be attached thereto by squeeze. The silicon rubber solution passes through the meshes of the pattern portion 22a, to be attached onto the electrode pattern 3 of the thyristor element 1.

The printing screen member 20 is then removed, so that an aligning pattern member 23 in thickness of about 0.2 to 0.5 mm is formed in a projecting manner on the electrode pattern 3 of the thyristor element 1 as shown in FIG. 4. In this state, the silicon rubber material forming the aligning pattern member 23 is hardened in an atmosphere under sufficient humidity of 40 to 60%. The material of the aligning pattern member 23 is not restricted to silicon rubber, and may be selected from other rubber material and synthetic resin material having sufficient insulatability.

Then, as shown in FIG. 5, the insertion electrode panel 4 is overlapped on the thyristor element 1 with the pattern hole 5 alignedly fitted with the aligning pattern member 23, and a passivation rubber member 6 is attached to the outer circumferential portion of the thyristor element 1.

When the insertion electrode panel 4 is relatively thick, the screen 22 may be formed by a metal mask screen, whose thickness is relatively large.

Figure 2:
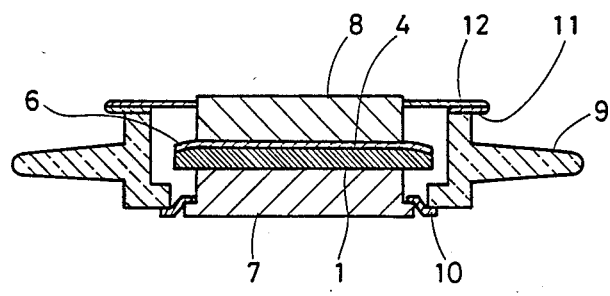
FIG. 2 is a roughly illustrated cross-sectional view of a compression-bonded thyristor assembled by sealing the thyristor element to which the insertion electrode panel as shown in FIG. 1 is fixed.

The thyristor element 1 to which the insertion electrode panel 4 is fixed in the aforementioned manner is assembled with outer electrode discs 7 and 8 and an insulating enclosure 9 and sealed in a similar manner to that described above with reference to FIG. 2.

Figure 6:
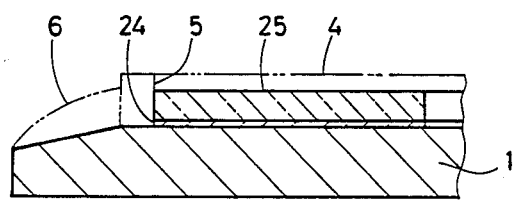
FIG. 6 is an enlarged cross sectional view illustrative of a state in which an aligning pattern member is attached on a semiconductor element according to another embodiment of the present invention.

FIG. 6 is an enlarged cross-sectional view showing a state in which an aligning pattern member is attached onto a semiconductor element according to another embodiment of the present invention. In the embodiment as shown in FIG. 6, a binder member 24 of, e.g., cold-setting silicon rubber solution is thinly coated by screen printing etc. on an electrode pattern 3 of a thyristor element 1, followed by bonding thereon an aligning pattern member 25 which is previously formed identically to the electrode pattern 3. The aligning pattern member 25 may be formed by a plate of inorganic insulating material such as a ceramic plate and a glass plate. Since, in this case, the height of the aligning pattern member 25 can be made relatively large, the insertion electrode panel 4 may be made relatively thick to be, e.g., about 1 mm in thickness.

Although the insertion electrode panel 4 is preferably made thin to be about 0.2 to 0.5 mm in thickness as hereinabove described for reducing its electric resistance, there is required improvement in thermal absorption capacity of the insertion electrode panel 4 rather than reduction of the electric resistance of the same when the device is used for high power. In such a case, thickness of the insertion electrode panel 4 must be made small, to be about 1 mm as hereinabove described.

The aligning pattern member 25 is not necessarily made in the aforementioned manner, and may be formed by attaching far ultraviolet vulcanized resin onto the electrode pattern 3 of the thyristor element 1 by screen printing, to be hardened by irradiation of ultraviolet rays.

Further, although the above description of the embodiments has been made with respect to a compression-bonded thyristor applied as a compression-bonded semiconductor device, the present invention is not restricted to the compression-bonded thyristor, and may be widely applied to compression-bonded devices such as a power transistor, a power triac, a power gate turn-on thyristor and a power reverse-conducting thyristor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fixing an insertion electrode panel in a compression-bonded semiconductor device wherein an insertion electrode panel having a pattern hole is overlapped on a semiconductor element having an electrode pattern on its surface, with said pattern hole, being identically formed to said electrode pattern for receiving the same, aligned with said electrode pattern and the outer circumferential portion of said insertion electrode panel is fixed to said semiconductor element by attaching thereto a passivation rubber member, said method comprising the steps of:

forming on said electrode pattern of said semiconductor element an aligning pattern member of an insulating material formed identically to said electrode pattern to be attached thereto in a projecting manner from said surface of said semiconductor element; and overlapping said insertion electrode panel on said semiconductor element with said pattern hole fitted with said aligning pattern member.

2. A method of fixing an insertion electrode panel in a compression-bonded semiconductor device in accordance with claim 1, wherein said step of forming said aligning pattern member includes the step of attaching a silicon rubber member onto said electrode pattern of said semiconductor element by screen printing and hardening the same.

3. A method of fixing an insertion electrode panel in a compression-bonded semiconductor device in accordance with claim 1, wherein said step of forming said aligning pattern member includes the step of attaching a far ultraviolet vulcanized resin member onto said electrode pattern of said semiconductor element by screen printing and hardening the same by irradiation of ultraviolet rays.

4. A method of fixing an insertion electrode panel in a compression-bonded semiconductor device in accordance with claim 1, wherein said step of forming said aligning pattern member includes the step of attaching an aligning pattern member of inorganic insulating material formed identically to said electrode pattern of said semiconductor element on said electrode pattern by a binder.

5. A method of fixing an insertion electrode panel in a compression-bonded semiconductor device in accordance with claim 4, wherein said binder is coated on said electrode pattern by screen printing.

6. A method of fixing an insertion electrode panel in a compression-bonded semiconductor device in accordance with claim 1, wherein said semiconductor element comprises of a thyristor element.

* * * * *